United States Patent [19]

Maerz et al.

[11] Patent Number: 5,492,791
[45] Date of Patent: Feb. 20, 1996

[54] PHOTOSENSITIVE MATERIAL AND METHOD FOR MAKING COLOR-PROOFING FILMS

[75] Inventors: Karin Maerz, Mainz; Volker Matz, Frankfurt; Detlev Seip, Kelkheim, all of Germany; Stephan J. W. Platzer, Califon, N.J.

[73] Assignee: Hoechst Aktiengesellschaft, Frankfurt, Germany

[21] Appl. No.: 432,048

[22] Filed: Apr. 28, 1995

Related U.S. Application Data

[63] Continuation of Ser. No. 168,120, Dec. 15, 1993.

[30] Foreign Application Priority Data

Dec. 19, 1992 [DE] Germany ............... 42 43 253.7

[51] Int. Cl.$^6$ ..................... G03C 1/76
[52] U.S. Cl. ............ 430/262; 430/256; 430/259; 430/260
[58] Field of Search ................ 430/256, 259, 430/260, 262

[56] References Cited

U.S. PATENT DOCUMENTS

| | | | |
|---|---|---|---|
| 3,988,157 | 10/1976 | Van Paesschen et al. | 430/536 |
| 4,123,278 | 10/1978 | Van Paesschen et al. | 430/535 |
| 4,440,590 | 4/1984 | Collins et al. | 156/234 |
| 4,506,003 | 3/1985 | Ruckert et al. | 430/270 |
| 4,889,787 | 12/1989 | Musser | 430/166 |
| 4,895,787 | 1/1990 | Platzer | 430/253 |
| 5,236,806 | 8/1993 | Platzer | 430/260 |
| 5,248,583 | 9/1993 | Lundquist et al. | 430/263 |
| 5,346,801 | 9/1994 | Watanabe et al. | 430/253 |

FOREIGN PATENT DOCUMENTS 0525624  2/1993  European Pat. Off. .

*Primary Examiner*—Hoa Van Le
*Attorney, Agent, or Firm*—John M. Genova

[57] ABSTRACT

A photosensitive material for making color-proofing films for multicolor printing is described, with A) a transparent flexible support of plastic,
  B) a photopolymerizable layer on (A) which contains
    B1) a polymeric binder,
    B2) a compound polymerizable by a flee-radical mechanism,
    B3) a compound which is capable of initiating the polymerization of (B2) under the action of actinic light and
    B4) a dye or a color pigment in a primary color of the multicolor print, and
  C) a thermoplastic adhesive layer which comprises at least one polymer which contains units (C1) with aliphatic side chains having at least 5 carbon atoms.

The material is processed by laminating to an image receptor sheet, exposure and peeling apart of support and image receptor sheet, the unexposed layer areas remaining together with the adhesive layer on the image receptor sheet. These steps are repeated with at least one further image in primary colors. The material provides for a reduction of the background stain in the non-image areas.

11 Claims, No Drawings

PHOTOSENSITIVE MATERIAL AND METHOD FOR MAKING COLOR-PROOFING FILMS

This is a continuation of application Ser. No. 08/168,120 filed on Dec. 15, 1993.

The invention relates to a photosensitive material, in particular a photopolymerizable material, for making color-proofing films for multicolor printing. It also relates to a color-proofing method, in which a multicolor image is produced on an image receptor sheet from a plurality of images in primary colors in register. The images in primary colors are made by laminating a photopolymerizable layer, colored in a primary color of the multicolor print, to the image receptor sheet, exposure under the respective color separation, developing the image by peeling off the support of the photopolymerizable layer together with the non-image areas adhering thereto, and repeating the same steps with a photopolymerizable layer of another primary color.

Such a color-proofing method and a material intended for this purpose have been disclosed by U.S. Pat. No. A 4,895,787. This material is composed of a transparent support, whose surface has preferably been pretreated for adhesion promotion, a photopolymerizable layer which contains a dye or a color pigment in a primary color of the multicolor print, and a thermoplastic adhesive layer, which can be activated by heating, on the photopolymerizable layer. After lamination to an image receptor sheet, the material is exposed through the support and then developed by peeling the support and image receptor sheet apart. The exposed areas of the photosensitive color layer then remain on the support, while the unexposed areas together with the complete adhesive layer remain on the image receptor sheet. Thus, the method is positive-working.

This processing method has the great advantage that it does not require any alkaline or acidic solutions or any organic solvents for development, eliminating disposal thereof. A disadvantage of this method is the background stain which appears in the non-image areas, particularly if the colors magenta and yellow are used. The background stain is caused by residues of dye or color pigment which remain after the peeling-off step on the surface of the adhesive layer in the case of unduly strong adhesion between the photopolymerizable layer and the adhesive layer. A further cause of the undesired coloration of the non-image areas can be the diffusion of the dye or color pigment into the adhesive layer, which diffusion takes place during the preparation of the material or during the lamination.

It was the object of the invention to reduce the background stain appearing in the non-image areas.

The invention relates to a photosensitive material for making color-proofing films for multicolor printing with A) a transparent flexible support of plastic,
B) a photopolymerizable layer on (A) which contains
  B1) a polymeric binder,
  B2) a compound polymerizable by a free-radical mechanism,
  B3) a compound which is capable of initiating the polymerization of (B2) under the action of actinic light and
  B4) a dye or a color pigment in a primary color of the multicolor print, and
C) a thermoplastic heat-activatable adhesive layer.

In the material according to the invention, the adhesive layer (C) comprises at least one polymer which contains units (C1) with aliphatic side chains having at least 5 carbon atoms. The feature of the adhesive layer (C) is that the adhesion between it and the photopolymerizable layer (B) is reduced as compared with those adhesive layers which do not contain the polymers described. The background stain is reduced due to the diminished adhesion between (B) and (C). The action of the polymer with units (C1) can be regarded as that of an internal lubricant.

The invention also provides a method for making a multicolor image, which comprises laminating a photosensitive material of the nature and composition defined above by its adhesive layer (C) under pressure to an image receptor sheet, imagewise exposing through the support under a color separation, peeling the support together with the exposed areas of the photopolymerizable layer of from the image receptor sheet and repeating the steps of laminating, exposure and peeling-off with at least one photosensitive material of another primary color and the respective other color separation.

Another embodiment of the process according to the invention comprises applying an adhesive layer (C) of the composition given above to an image receptor sheet, laminating a photosensitive material composed of a transparent flexible support (A) and a photopolymerizable layer (B) of the composition given above by the photopolymerizable layer to the adhesive layer (C), imagewise exposing the photopolymerizable layer through the support under a color separation, peeling the support together with the non-image areas off from the image receptor sheet and repeating the steps of

- applying an adhesive layer,
- laminating to a photosensitive material,
- exposure and
- peeling off with at least one further photosensitive material and color separation of another primary color, the exposure taking place in register with the first image in primary colors produced on the image receptor sheet.

The thermoplastic adhesive layer (C) should have a softening temperature of about 40° to about 200° C., preferably of about 60 to about 130° C., and it can be applied from a dispersant, solvent or solvent mixture. The possible procedures are as follows:

$a_1$) The adhesive layer can be applied directly to the photopolymerizable layer, if the latter is not incipiently dissolved by the dispersant, solvent or solvent mixture used.

$b_1$) The adhesive layer can also be initially applied to a temporary support and be transferred from there by lamination and subsequent peeling-off of the support to the photopolymerizable layer or to the image receptor sheet. In the case of transfer to the image receptor sheet, the photopolymerizable layer is then laminated in a second step to the adhesive layer thus obtained.

$c_1$) The adhesive layer can be applied to the image receptor sheet and dried. The photopolymerizable layer is then laminated to the adhesive layer thus obtained.

The direct application of the adhesive layer from solvents to the photopolymerizable layer is preferred. Suitable coating solvents, which do not incipiently dissolve the photopolymerizable layer, are water and, depending on the composition of the photopolymerizable layer, aliphatic, alicyclic and aromatic hydrocarbons and alcohols as well as mixtures of these. Typical examples are hexane, cyclohexane, toluene, butanol or cyclohexanol. Many polymers can be applied from a dispersion; however, application from solution is preferred, aqueous solutions being particularly suitable.

The essential feature of the polymers contained in the thermoplastic adhesive layer (C) are side-chain aliphatic radicals having at least 5 and preferably 7 to 20 carbon atoms. These radicals can be saturated or unsaturated, preferably saturated, straight-chain or branched hydrocarbon radicals which can be unsubstituted or substituted by halogen atoms or lower alkoxy groups, preferably having 1 to 4 carbon atoms.

The polymer can be a homopolymer or copolymer of vinyl monomers which contain said side-chain radicals. Copolymers with units (C1) are preferred, in particular those which contain these units in a proportion of about 5 to about 35% by weight.

Examples of possible vinyl monomers which form the units (C1) are vinyl esters of aliphatic carboxylic acids, for example of caproic acid, caprylic acid, capric acid, lauric acid, myristic acid, stearic acid, palmitic acid, 4-methoxyvaleric acid, 6-chloropelargonic acid, 3,4-dimethylheptanoic acid, Versatic acid or of mixtures of these acids, vinyl alkyl ethers, for example vinyl hexyl ether, vinyl isoheptyl ether, vinyl dimethyldecyl ether etc., and also acrylates or methacrylates of monohydric alcohols having 5 to 20 carbon atoms.

With advantage, the polymers used in the adhesive layer (C) are those which contain units (C1) of the formula I

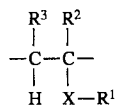

in which

R$^1$ is an aliphatic radical having at least 5 carbon atoms,
X is

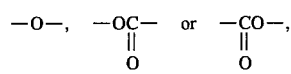

R$^2$ is
H or CH$_3$ and
R$^3$ or an alkyl group having 1 or 2 carbon atoms.

Those copolymers of units (C1) and (C2) are preferred in which the units (C2) are of the formula II

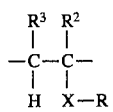

in which

R is an aliphatic radical having 1 to 4 carbon atoms, preferably 1 or 2 carbon atoms, and
the other symbols are as defined for formula I.

Examples of compounds which polymerize to give units of the formula II are vinyl esters such as vinyl acetate, vinyl propionate, vinyl butyrate and vinyl methoxyacetate; (meth)acrylates such as methyl methacrylate, ethyl acrylate and 2-chloroethyl methacrylate; and crotonates such as methyl or ethyl crotonate.

Those polymers are particularly suitable which contain additional units (C3) with acid groups, for example carboxyl groups or salts thereof. Examples of unsaturated carboxylic acids capable of forming units (C3) are acrylic acid, methacrylic acid, vinylacetic acid and crotonic acid.

If the adhesive layer contains the preferred terpolymers, these preferably have a content from about 5 to about 35% by weight of units (C1), about 45 to about 92% by weight of units (C2) and about 3 to about 20% by weight of units (C3). Polymers with about 15 to about 30% by weight of units (C1), about 55 to about 80% by weight of units (C2) and about 3 to about 15% by weight of units (C3) are particularly preferred. The content of units (C3) is preferably at least of such a magnitude that the polymer can be dissolved in aqueous-alkaline solutions and applied from such a solution.

Those terpolymers are in general used as constituents of the adhesive layer (C) whose 20% solution in ethyl acetate has a viscosity of about 4 to about 12, preferably about 5 to about 9, mPas at 20° C. The viscosity is measured by means of a Höppler viscometer according to DIN 53 015 and represents, under otherwise identical conditions, a measure of the molecular weight.

The proportion of units (C1) in the polymer present in the adhesive layer and its molecular weight must be carefully matched to one another. The aliphatic side chains of the units (C1) effect a reduction in the adhesion between the photopolymerizable layer (B) and the adhesive layer (C). The adhesion between said layers can be controlled in the desired way by means of their quantitative proportion and their nature and also by the molecular weight of the polymer. Owing to the reduction in adhesion as compared with known adhesive layers with polymers having shorter aliphatic side chains, all those properties are positively affected which require a low adhesion between photopolymerizable layer (B) and adhesive layer (C), especially the background stain and the gloss of the color image as well as the ease of handling of the material in the peel-apart development.

On the other hand, the adhesion must not be unduly reduced, since the resolution then suffers. This effect is compensated by reducing the proportion of units (C1) in the polymer or by adding a polymer which does not contain any units (C1), and by increasing the molecular weight. As the examples show, a product having the desired property spectrum can be obtained by a suitable choice of the abovementioned parameters.

The copolymers of units (C2) and (C3) are above all suitable as additive polymers without units (C1). In general, a good combination of properties is obtained by additional quantities of about about 20 to about 50% by weight of these copolymers, relative to the total weight of the layer.

Good results are also obtained with polymers which do not contain any units (C3). Since these polymers are soluble only in organic solvents, adhesive layers with such polymers can in general not be applied from solution to the photopolymerable color layer, because most of these layers are soluble in organic solvents. In this case, only the less preferred method is possible, in which the adhesive layer is prepared in a separate process step on a separate temporary support and transferred from there by lamination either to the photopolymerizable layer (B) or to the image receptor sheet.

In addition to the polymer described, with units (C1) and, if appropriate, a copolymer of units (C2) and (C3) or a homopolymer of units (C2), the adhesive layer can also contain further constituents in a smaller quantity, for example up to about 15% by weight. Possible such additives are plasticizers, adhesion promoters, residual solvents, flow agents, lubricants, antistatics, inert fillers, fluorescent brighteners and/or UV absorbers. The layer weight of the adhesive layer is in general in the range from about 2 to about 30 g/m$^2$ and preferably about 4 to about 15 g/m$^2$.

The photopolymerizable layer (B) of the material according to the invention contains, as essential constituents, a polymeric binder (B1), a compound (B2) polymerizable by a free-radical mechanism, a compound (B3) which forms free radicals and thus initiates the polymerization of the polymerizable compound (B2) under the action of actinic light, and a dye or a color pigment (B4) in a primary color of the multicolor print. Examples of photopolymerizable layers of this composition are given in U.S. Pat. No. A 4,895,787, which is incorporated herein by reference.

The polymeric binder (B1) is intended to confer homogeneity and strength on the layer. Suitable binders are styrene/maleic anhydride copolymers and styrene/maleic acid half-ester copolymers, acrylate ester polymers and copolymers, polyamides, polyvinylpyrrolidones, cellulose derivatives such as cellulose esters and ethers, phenolic resins, polyvinyl esters, polyvinyl acetals, for example polyvinyl butyral, propional or formal. The quantitative proportion of the binder is in general about 15 to about 70 and preferably about 20 to about 50% by weight, relative to the weight of the solid layer.

The polymerizable compound (B2) contains at least one and preferably at least two terminal double bonds polymerizable by a free-radical mechanism and is not gaseous at temperatures below 100° C. and at normal pressure. Esters and amides of acrylic and methacrylic acid are preferred. In particular, the esters with polyhydric alcohols are employed with advantage. Examples are di-, tri-, tetra- and poly-ethylene glycol di(meth)acrylate, the di(meth)acrylates of oligo- and poly-propylene glycols, 1,4-butanediol di(meth)acrylate, trimethylolpropane tri(meth)acrylate and trimethylolethane tri(meth)acrylate, pentaerythritol tri- and tetra-acrylate or -methacrylate, and dipentaerythritol tetra-, penta- and hexa-(meth)acrylate. The quantitative proportion of polymerizable compound is in general about 15 to about 70 and preferably about 20 to about 60% by weight.

Suitable photoinitiators (B3) are essentially all compounds or compound combinations known for this purpose. Examples are benzoin ethers, benzil ketals, polynuclear quinones, benzophenone derivatives, triarylimidazolyl dimers, and photosensitive trihalogenomethyl compounds, for example trichloromethyl-s-triazines. 2,3-Bis-aryl-quinoxalines, such as are described in U.S. Pat. No. A 3,765,898, and 2-aryl-4,6-bis-trichloromethyl-s-triazines are particularly preferred. The quantity of photoinitiator or photoinitiator combination is in general between about 1 and about 25 and preferably between about 5 and about 15% by weight.

The dyes and/or color pigments (B4) are selected such that they correspond to the primary colors of the multicolor print, namely cyan (blue-green), magenta (purple), yellow and black. Pigments are in general preferred. Examples are Permanent Yellow G (C. I. 21,095), Permanent Yellow GR (C. I. 21,100), Permanent Yellow DHG (C. I. 21,090), Permanent Ruby L3B (C. I. 15,850:1), Permanent Pink F3B (C. I. 12,433), Hostaperm Pink E (C. I. 73,915), Hostaperm Red-Violet ER (C. I. 46,500), Permanent Crimson FBB (C. I. 12,485), Hostaperm Blue B2G (C. I. 4,160), Hostaperm Blue A2R (C. I. 74,160) and Printex 25 (carbon black). If necessary, the pigments can be blended to obtain the desired color shade. The inorganic or organic pigments are in general dispersed or pasted together with a part of the binder in a suitable solvent. The mean particle size is in general below 1 μm, preferably below 0.2 μm.

The quantitative proportion of the dye or pigment or of the dye or pigment mixture is in general about 8 to about 40% by weight and preferably about 12 to about 30% by weight of the photopolymerizable layer.

If desired, the photopolymerizable layer (B) can contain further constituents such as hydrogen donors, sensitizers, polymerization inhibitors, plasticizers, residue dissolvers, surfactants, surface-leveling agents, lubricants, adhesion promoters, antistatics, inert fillers, fluorescent brighteners and/or UV absorbers. It has in general a layer weight from about 0.2 to about 5 g/m², preferably about 0.3 to about 3 g/m².

After drying of the photopolymerizable color layer, the adhesive layer which can be thermally activated is applied thereto in the manner described.

The supports used are transparent, flexible, dimensionally stable sheets of plastics, for example polyesters, polycarbonates and the like. Particularly preferred are polyester sheets, in particular biaxially stretched and thermofixed sheets, for example of polyethylene terephthalate. These should remain dimensionally stable at the required lamination temperatures, i.e. from about 60° to about 150° C. Their thickness is in general about 10 to about 200 and preferably about 25 to about 80 μm. The support is advantageously given an adhesion-promoting pretreatment on one or both sides and can have a smooth or a rough and/or dull surface, preferably a smooth surface.

For carrying out the method according to the invention, the photosensitive material described above is laminated by the adhesive layer to an image receptor sheet. The latter can be composed of plastic, a plastic-coated special paper or of customary printing paper. Other white and in some cases also non-white receptor sheets can also be used. A printing paper which is dimensionally stable under the lamination conditions is usually preferred, since a visual impression largely approaching the later print is achieved thereby. The lamination is advantageously carried out in an apparatus intended for this purpose, under pressure and at an elevated temperature. The lamination temperature is usually in the range of about 60° to about 130° and preferably between about 80° and about 120° C. After the lamination, the photopolymerizable layer is imagewise exposed through the support, in general in contact under a positive color separation in the known manner. After the exposure, the support is peeled off by hand or in a suitable device. The peeling angle should be at least 90°, and an angle of 180° is particularly preferred. In this way, the exposed areas of the photopolymerizable layer are removed together with the support, while the unexposed areas remain on the image receptor sheet together with the entire adhesive layer. In this way, a positive image in primary colors is obtained. Every further color-proofing film is laminated in the manner described to the preceding image in primary colors, exposed, preferably in register, and developed by peeling off the support.

The invention is explained by the examples which follow. All percentage data and quantitative proportions are to be understood in units by weight. In Examples 1 and 2, photosensitive materials with adhesive layers according to the state of the art are described. Examples 3 to 8 serve to illustrate the advantages which result from the use of photosensitive materials according to the invention.

The synthesized polymers are characterized in each case by measuring the viscosities of a 20% solution in ethyl acetate (at 20° C., Höppler viscometer, DIN 53 015), and via the glass transition point Tg determined by differential thermal analysis using the type 1090 measuring instrument from du Pont de Nemours & Co., heating rate 20 K/minute.

EXAMPLE 1 (Comparison Example)

The coating solutions for the photopolymerizable layers are composed of the following components, in parts by weight:

| Constituent: | Parts by weight | | | |
| --- | --- | --- | --- | --- |
| | Cyan | Magenta | Yellow | Black |
| Dipentaerythritol pentaacrylate | 39.0 | 35.5 | 38.2 | 36.1 |
| 2-Diphenylyl(4)-4,6-bis-trichloromethyl-s-triazine | 9.8 | 7.8 | 9.5 | 9.6 |
| Polyvinyl formal (Formvar ® 12/85) | 31.3 | 36.5 | 35.4 | 28.0 |
| Hostaperm ® Blue B2G (C.I. 74,160) | 19.0 | — | — | — |
| Permanent Crimson FBB (C.I. 12,485) | — | 18.5 | — | — |
| Permanent Yellow GR (C.I. 21,100) | — | 0.7 | 16.4 | — |
| Carbon black (Printex ® 25) | 0.4 | 0.5 | — | 24.8 |
| Silicone oil (Edaplan ® LA 411) | 0.5 | 0.5 | 0.5 | 0.6 |

Each of the four mixtures was dissolved in a solvent mixture of 1000 parts by weight of tetrahydrofuran, 680 parts by weight of 1-methoxy-2-propanol and 190 parts by weight of gamma-butyrolactone.

The pigments are dispersed beforehand with a part of the binder and the butyrolactone. The mean particle size is below 0.2 µm. The dispersion and the remaining constituents are mixed and applied to a 50 µm thick, biaxially stretched and thermofixed polyethylene terephthalate sheet which has been pretreated on both sides for improving the adhesion (Melinex® 505). The layers are dried at 70° C. The layer weights are between 0.6 and 0.8 g/m$^2$.

The solution of the adhesive layer is composed as follows:

| Constituent | Parts by weight |
| --- | --- |
| 95:5 vinyl acetate/crotonic acid copolymer (Mowilith ® Ct5) | 96.6 |
| Polyvinyl methyl ether (Lutonal ® M40) | 1.9 |
| Sodium sulfite | 1.4 |
| Water | 520.0 |
| Ethanol | 43.0 |
| Aqueous ammonia, 25% | 8.5 |

The solution is applied to the dry photopolymerizable layers. layer weight of the adhesive layer is 6.5 g/m$^2$.

One of the sheets prepared in this way, for example the cyan color sheet, is laminated at 85° C. to plastic-coated special paper and exposed under the cyan color separation film. The support is continuously peeled off by hand under an angle of 180°. The adhesive layer and the positive cyan image remain on the paper, and the further photopolymerizable color layers are successively laminated thereto and processed in the same way.

EXAMPLE 2 (Comparison Example)

The composition of the coating solutions for the photopolymerizable layers is the same as in Example 1, but the photoinitiator is replaced in each case by the same quantity of 2,3-bis-(4-methoxyphenyl)-quinoxaline. The composition of the adhesion-promoting solution and the further processing are not changed.

In both comparison examples, a tonal value range from 2 to 98% can be reached for all colors in a screen of 60 lines/cm, i.e. the screen dots, whose size corresponds to the indicated area coverage in %, are still reproduced. As a measure of the background coloration, the optical density in the non-image areas is determined by means of a densitometer. For this purpose, a color sheet is laminated in the manner described to the receiving sheet and exposed for the optimum exposure time, determined beforehand, i.e. the exposure time at which the greatest tonal value range is reached. To intensify the measuring effect, the procedure is, after the support has been peeled off, repeated a further three times with color sheets of the same color. The optical density (D) of the image receiver sheet without proofing image, which is allocated the value zero, serves as a reference for measuring the background coloration. For the colors cyan (C), magenta (M), yellow (Y) and black (K), the following optical densities (D) for the image background are measured, with four plies in each case:

| 1 | C | M | Y | K | 2 | C | M | Y | K |
| --- | --- | --- | --- | --- | --- | --- | --- | --- | --- |
| D | 0.03 | 0.07 | 0.08 | 0.00 | D | 0.03 | 0.07 | 0.13 | 0.00 |

The high optical densities for magenta and yellow show that the background stain of the four-colored proofing image is to be ascribed above all to these two colors. Density values of more than 0.02 are already clearly perceptible visually and hence interfere with the color impression which is decisive for a color-proofing method.

EXAMPLE 3:

150 parts by weight of a solution composed of 20.7 parts by weight of tert-butylperoxy 2-ethylhexanoate, 743 parts by weight of vinyl acetate, 318 parts by weight of vinyl C$_9$-alkanoate (Veova® 9), 60 parts by weight of crotonic acid and 66 parts by weight of isopropanol are incipiently polymerized at 70° C. On reaching 78° C., the residual monomer solution is metered in over a period of four hours. After a final polymerization phase of one hour, the solvent is distilled off. After cooling, the polymer is granulated. It is designated as terpolymer No. 1 and contains the following monomer proportions:

| Vinyl acetate | 66.5% |
| --- | --- |
| Veova 9 | 28.5% |
| Crotonic acid | 5.0% |
| Viscosity (20% solution of the polymer in ethyl acetate): | 9.16 mPas |
| Glass transition point (Tg): 37° C. | |

The following solution of adhesive layer is in each case applied to the photopolymerizable layer of color-proofing films in the colors yellow and magenta from Example 1, and dried:

| Constituent | Parts by weight |
| --- | --- |
| Terpolymer No. 1 | 96.6 |
| Lutonal M 40 | 1.9 |
| Sodium sulfite | 1.4 |
| Water | 520.0 |
| Ethanol | 43.0 |
| Aqueous ammonia, 25% | 8.5 |

The layer weight of the dry adhesive layer is 6.5 g/m$^2$.

The color-proofing films thus obtained are each processed in the manner described under Example 1 to give a single-color, four-ply image. The tonal value range is 4 to 96%. For the background stain, the following optical densities (D) are measured:

|   | M | Y |
|---|---|---|
| D | 0.02 | 0.06 |

For magenta, a significant reduction of the background stain, and a slight reduction for yellow, can be achieved as compared with Examples 1 and 2.

EXAMPLE 4

For the adhesive layer, a terpolymer (No. 2) is used which has the same composition as the terpolymer No. 1, but a lower molecular weight:

| | |
|---|---|
| Viscosity (20% solution of the polymer in ethyl acetate): | 5.52 mPas |
| Glass transition point: 36° C. | |

The solution of the adhesive layer, which is applied to the photopolymerizable layer of color-proofing films for the colors magenta and yellow from Example 1, has the following composition:

| Constituent | Parts by weight |
|---|---|
| Terpolymer No. 2 | 96.6 |
| Lutonal ® M 40 | 1.9 |
| Sodium sulfite | 1.4 |
| Water | 520.0 |
| Ethanol | 43.0 |
| Aqueous ammonia, 25% | 8.5 |

The layer weight of the dry adhesive layer is 6.5 g/m².

The color-proofing films thus obtained are each processed in the manner described under Example 1 to give a single-color, four-ply image.

|   | M | Y |
|---|---|---|
| D | 0.01 | 0.02 |
| Tonal value range | 10–85% | 4–95% |

The use of the terpolymer No. 2 gives a particularly effective reduction in background stain. The adhesion between the photopolymerizable layer and the adhesive layer decreases generally with the molecular weight of the polymer present in the adhesive layer. However, an unduly low adhesion between photopolymerizable layer and adhesive layer leads, as shown by Example 4, to a tonal value range which is no longer sufficient for the color-proofing method.

EXAMPLE 5

The following adhesive layer is applied to the photopolymerizable layer of a magenta color-proofing film from Example 1, and dried:

| Constituent | Parts by weight |
|---|---|
| Terpolymer No. 2 | 64.4 |
| Mowilith Ct 5 | 32.2 |
| Lutonal ® M 40 | 1.9 |
| Sodium sulfite | 1.4 |
| Water | 520.0 |
| Ethanol | 43.0 |
| Aqueous ammonia, 25% | 8.5 |

The layer weight of the dry adhesive layer is 6.5 g/m².

The color-proofing films thus obtained are each processed in the manner described under Example 1 to give a single-color, four-ply image. In the single-color image comprising four plies, the optical density of the image background is D=0.02, and the tonal value range is 2 to 97%.

EXAMPLE 6

As described in Example 3, the terpolymer No. 3 is prepared from the following starting substances:

| Monomer proportions | |
|---|---|
| Vinyl acetate | 76.0% |
| Veova ® 9 (vinyl C₉-alkanoate) | 19.0% |
| Crotonic acid | 5.0% |
| Viscosity (20% solution of the polymer in ethyl acetate): | 9.20 mPas |
| Glass transition point: 39° C. | |

Composition of the solution of adhesive layer:

| Constituent | Parts by weight |
|---|---|
| Terpolymer No. 3 | 96.6 |
| Lutonal M 40 | 1.9 |
| Sodium sulfite | 1.4 |
| Water | 520.0 |
| Ethanol | 43.0 |
| Aqueous ammonia, 25% | 8.5 |

The solution of adhesive layer is applied to the photopolymerizable layer of color-proofing films for the colors magenta and yellow from Examples 1 and 2, and dried. The layer weight of the dry adhesive layer is 6.5 g/m².

As described in detail in Example 1, single-color images comprising four plies of the particular color are prepared. The following optical densities are measured for the background stain of the non-image areas:

| 1 | M | Y | 2 | M | Y |
|---|---|---|---|---|---|
| D | 0.02 | 0.06 | D | 0.02 | 0.08 |

The tonal value range is 2–98% in both cases. With the same reduction in the background stain as in Example 3, the tonal value range is here greater and corresponds to the quality obtained in Examples 1 and 2.

EXAMPLE 7

A terpolymer is prepared analogously to the instructions given in Example 3 from the following components and designated terpolymer No. 4:

11

| Monomer proportions | |
|---|---|
| Vinyl acetate | 76.0% |
| Veova 10 (vinyl C$_{10}$-alkanoate) | 19.0% |
| Crotonic acid | 5.0% |
| Viscosity (20% solution of the polymer in ethyl acetate): | 9.10 mPas |
| Glass transition point: 41° C. | |

Composition of the solution of adhesive layer:

| Constituent | Parts by weight |
|---|---|
| Terpolymer No. 4 | 96.6 |
| Lutonal M 40 | 1.9 |
| Sodium sulfite | 1.4 |
| Water | 520.0 |
| Ethanol | 43.0 |
| Aqueous ammonia, 25% | 8.5 |

The solution of adhesive layer is applied to the photopolymerizable layer of color-proofing films in the color magenta from Example 1, and dried. The layer weight of the dry adhesive layer is 6.5 g/m$^2$.

As described in detail in Example 1, single-color images comprising four plies of the particular color are prepared. For the background stain of the non-image areas, an optical density of D=0.03 is measured, the tonal value range is 2 to 98%.

EXAMPLE 8

A solution of adhesive layer of the following composition is applied to a support which is dimensionally stable when hot (polyester film from ICI, type Melinex 516, thickness: 50 μm), and dried:

| Constituent | Parts by weight |
|---|---|
| 80:20 vinyl acetate/vinyl laurate copolymer (Vinnapas ® B100/20VL) | 10.0 |
| Polyvinyl acetate (Vinnapas ® B100) | 10.0 |
| n-Butyl acetate | 80.0 |

The layer weight of the dry adhesive layer is 6 g/m$^2$.

This adhesive film is laminated at 85° C. to a receiving sheet of paper. The support is peeled off, and the adhesive layer remains on the receiving sheet. To this layer, a magenta color-proofing film, without an adhesive layer, according to Example 1 is laminated, likewise at 85° C., and exposed under the corresponding color separation. After the color-proofing layer support has been peeled off, the single image for the color magenta is obtained. This procedure is repeated until four superposed single images are also present in this example. The optical density of the in, age background is D=0.02, and the tonal value range is 2–98%.

We claim:

1. A photosensitive material for making color-proofing films for multicolor printing with
   A) a transparent flexible support of plastic,
   B) a photopolymerizable layer on (A) comprising
      B1) a polymeric binder,
      B2) a compound polymerizable by a free-radical mechanism,
      B3) a compound which is capable of initiating the polymerization of (B2) under the action of actinic light and
      B4) a dye or a color pigment in a primary color of the multicolor print, and
   C) a thermoplastic heat-activable adhesive layer, wherein the adhesive layer (C) comprises at least one polymer which contains units (C1) with an aliphatic side chain having at least 6 carbon atoms, wherein the units (C1) are of the formula I

in which

R$^1$ is an aliphatic radical having at least 6 carbon atoms,

X i

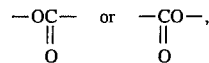

R$^2$ is H or CH$_{23}$ and

R$^3$ is H or an alkyl group having 1 or 2 carbon atoms.

2. A photosensitive material as claimed in claim 1, wherein the polymer present in the adhesive layer (C) is a copolymer of units (C1) and units (C2) of the formula II

in which

R is an aliphatic radical having 1 to 4 carbon atoms and the other symbols are as defined in claim 1.

3. A photosensitive material as claimed in claim 2, wherein the polymer present in the adhesive layer (C) additionally contains units (C3) which have been formed from an α,β-unsaturated carboxylic acid.

4. A photosensitive material as claimed in claim 3, wherein the polymer present in the adhesive layer (C) contains from 5 to 35% by weight of units (C1), from 45 to 92% by weight of units (C2) and from 3 to 15% by weight of units (C3).

5. A photosensitive material as claimed in claim 1, wherein the compound, from which the units (C1) have been formed, is a vinyl ester of a monocarboxylic acid containing at least 6 carbon atoms or methacrylate of a monohydric alcohol containing at least 6 carbon atoms.

6. A photosensitive material as claimed in claim 1, wherein the adhesive layer (C) further contains plasticizers, adhesion promoters, residual solvents, levelling agents, lubricants, antistatics, inert fillers, optical brigtheners and/or UV absorbers.

7. A photosensitive material as claimed in claim 1, wherein the thermoplastic adhesive layer (C) has a layer weight from about 2 to about 30 g/m$^2$.

8. A photosensitive material as claimed in claim 1, wherein the polymerizable compound (B2) contains at least two terminal double bonds polymerizable by a free-radical mechanism and is non-gaseous at temperatures below 100° C. and at normal pressure.

9. A photosensitive material as claimed in claim 8, wherein the polymerizable compound (B2) is an ether or an amide of acrylic or methacrylic acid.

10. A photosensitive material as claimed in claim 1, wherein the photopolymerizable layer (B) contains 15 to 70% by weight of the units (B1), 15 to 70% by weight of the polymerizable compound (B2), 1 to 25% by weight of the photoinitiating compound (B3) and 8 to 40% by weight of the dye or color pigment (B4), relative to the weight of the solid layer.

11. A photosensitive material as claimed in claim 1, wherein the transparent support (A) is a polyesterfilm.

* * * * *